United States Patent [19]
Bluzer et al.

[11] Patent Number: 4,488,163
[45] Date of Patent: Dec. 11, 1984

[54] HIGHLY ISOLATED PHOTODETECTORS

[75] Inventors: Nathan Bluzer, Silver Spring; Alfred P. Turley, Ellicott City; Francis J. Kub, Pasadena, all of Md.; Gerald M. Borsuk, Washington, D.C.

[73] Assignee: Westinghouse Electric Corp., Pittsburgh, Pa.

[21] Appl. No.: 225,900

[22] Filed: Jan. 19, 1981

[51] Int. Cl.³ .................. H01L 29/78; H01L 27/14; H01L 31/00; H01L 29/06
[52] U.S. Cl. .................................. 357/24; 357/30; 357/55
[58] Field of Search ............... 357/24 LR, 30, 55

[56] References Cited
U.S. PATENT DOCUMENTS

| | | | |
|---|---|---|---|
| 3,593,067 | 7/1971 | Flynn | 357/30 |
| 3,700,961 | 10/1972 | Fletcher et al. | 357/30 |
| 3,856,989 | 12/1974 | Weimer | 357/24 LR |
| 4,068,255 | 1/1978 | Kravitz et al. | 357/30 |
| 4,106,046 | 8/1978 | Nathanson et al. | 357/30 |
| 4,112,456 | 9/1978 | Lampe et al. | 357/24 R |
| 4,321,486 | 3/1982 | Boler et al. | 357/24 LR |

FOREIGN PATENT DOCUMENTS 7506795 12/1976 Netherlands .............. 357/24 LR

OTHER PUBLICATIONS

Kosonocky et al., "Basic Concepts of Charge-Coupled Devices", RCA Review vol. 36 (9/1975), pp. 566, 580-583.
Chamberlain "High Speed Scanner Photoelement with Gain", IBM Tech. Disclosure Bulletin vol. 19, (4/1977), pp. 4458-4460.

Primary Examiner—Gene M. Munson
Attorney, Agent, or Firm—W. G. Sutcliff

[57] ABSTRACT

An array of photodetectors is described incorporating a PNP vertical structure in a monosilicon substrate with individual photodetectors optically and electrically isolated from one another by open or oxide filled grooves. Both PN junctions of the PNP structure or originally reverse biased with one junction acting as the photodetector may operate in the forward biased photovoltaic mode with high radiant energy intensity. The minority carriers injected into the N region are absorbed by the other PN junction providing base-collector transistor action to prevent blooming.

4 Claims, 8 Drawing Figures

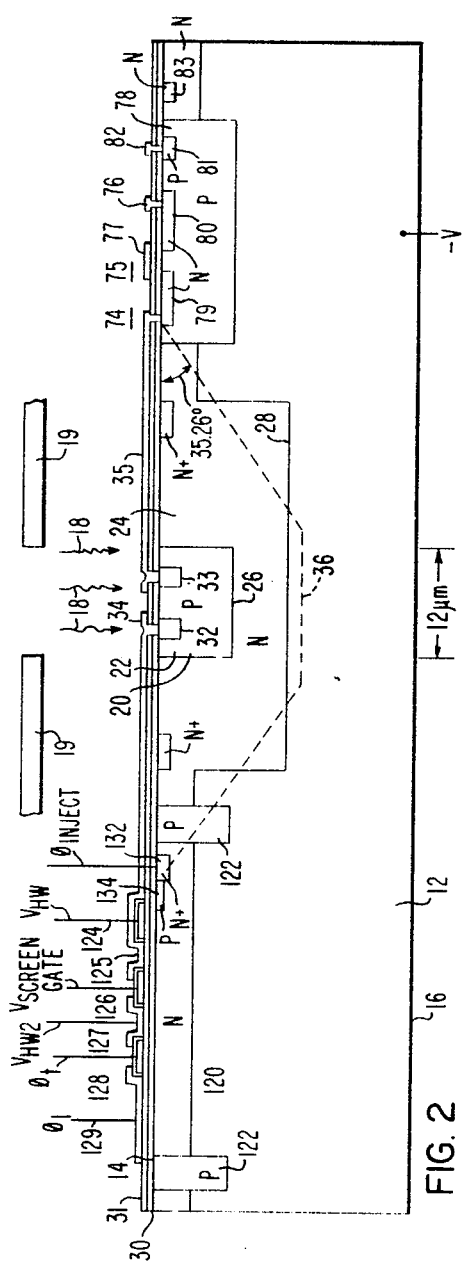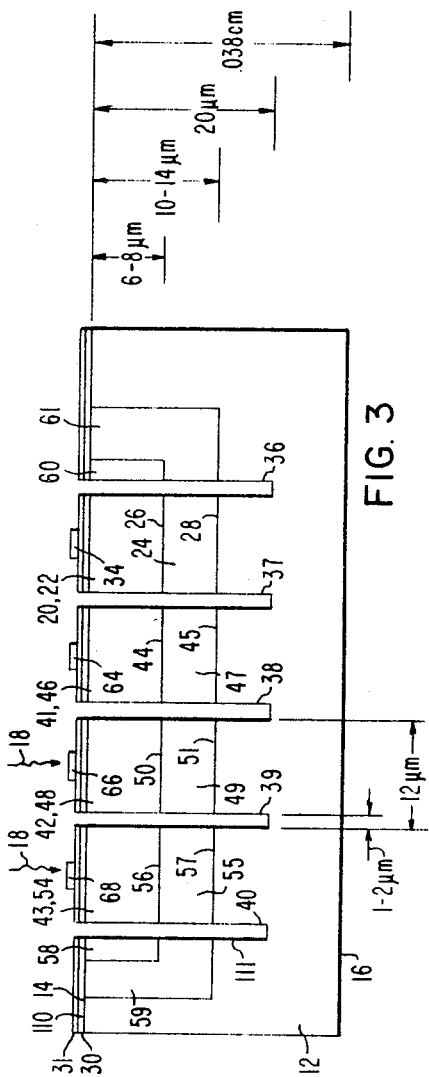
FIG. 2
FIG. 3

HIGHLY ISOLATED PHOTODETECTORS

GOVERNMENT CONTRACT

The Government has rights in this invention pursuant to Contract No. N00173-79-C-0485 awarded by the Department of the Navy.

BACKGROUND OF THE INVENTION

1. Field of the Invention

This invention relates to photodetectors and more particularly to an array of photodetectors each having high dynamic range and low optical and electrical cross-talk between detectors.

2. Description of the Prior Art

In the prior art, arrays of photodiodes have beeen fabricated by diffusing an array of P+ regions into an N-type substrate. When the photodiode array receives radiant energy in the infrared region such as 7,000 angstroms, the cross-talk is significant. For example, an array of photodiodes spaced apart on a center to center spacing of 12 microns and having a junction and depletion depth below the substrate surface of 5 microns would have 15 decibels cross-talk to a photodiode located 36 microns away from a photodiode illuminated with radiation having a wavelength of 8500 angstroms.

It is known in the art to improve the isolation of an array of photodiodes in a substrate by fabricating P+ regions in an N-type epitaxial or diffused layer of a predetermined depth on a P-type material substrate. Cross-talk isolation between photodiodes is improved by action of the PN junction formed between the N-type layer and the P-type substrate by collecting carriers generated deep in the silicon substrate thus preventing the carriers from diffusing to neighboring or adjacent photodiodes. The cross-talk isolation between one photodiode and another photodiode spaced 36 microns away would be about 30 decibels. One disadvantage of the PN junction between the N layer and the P-type substrate is the lower quantum efficiency resulting from loss of carriers generated in the PN junction or below.

A disadvantage of the above-described photodiode array structures is that the photo current resulting from impinging radiant energy at a photodiode may be of sufficient magnitude to completely discharge the reverse biased floating diode and cause it to become forward biased. A forward biased photodiode would inject minority carriers into the N layer which would diffuse to neighboring photodiodes causing their discharge resulting in blooming.

An array of photodiodes formed on an N-type substrate is described in U.S. Pat. No. 4,160,985 which issued on July 10, 1979 to T. I. Kamins and G. T. Fong. An array of P regions are diffused in an N-type layer which has a higher conductivity N-type layer below on an N-type substrate. The high conductivity N+ type layer reduces cross-talk between photodiodes by accelerating photogenerated charge carries toward the surface or P+ regions so that the carrier diffusion to distant photo sensing elements is minimized.

The use of narrow grooves or slots etched into the substrate material containing an array of photodetectors to provide electrical and optical isolation between the photodetectors is described in U.S. Pat. No. 4,106,046 which issued on Aug. 8, 1978 to H. C. Nathanson and M. M. Sopria and assigned to the assignee herein. In U.S. Pat. No. 4,106,046, elongated detectors formed in a silicon substrate were separated from one another by an isotropic etch on (110) surface oriented silicon wherein the grooves were aligned with the [111] planes to provide a depth to width ratio on the order of 400 to 1 when aligned within $\frac{1}{4}$ degree with respect to the [111] plane. One example of an etchant suitable for etching the silicon was described as 44% KOH:H$_2$O at a temperature of 85° C. and below. The grooves provide electrical isolation by physically separating adjacent detectors and provide optical isolation by the side walls of the grooves which reflect radiant energy from within a detector to prevent radiant energy from passing into an adjacent detector.

It is therefore desirable to provide an array of photodetectors, each detector having high dynamic range with low electrical and optical cross-talk between photodetectors.

It is further desirable to provide an array of photodiodes wherein each may operate in the reverse biased integrating mode for low level signals and in the forward biased photovoltaic mode for high level signals while preventing electrical and optical cross-talk and blooming.

It is further desirable to provide an array of photodiodes having electrical and optical isolation provided by a PN junction below the photodiode which may remove carriers passing through the forward biased diode by bipolar transistor action.

It is desirable to provide photodiodes which are electrically and optically isolated from one another by open or oxide filled grooves to prevent lateral diffusion of photogenerated carriers.

SUMMARY OF THE INVENTION

In accordance with the present invention, an array of photodiodes for sensing radiant energy over a large dynamic range and having low optical and electrical cross-talk is described comprising a substrate of crystalline material having an upper surface and a crystalline orientation, a layer of N-type material over a P-type substrate with P regions formed in the upper surface of the substrate in the N layer to form an array of photodiodes. The floating P regions forming the photodiodes include means for providing a reverse biased voltage on the P regions to permit charge integration at low level signals and permit a forward biased photovoltaic mode for high level signals. Electrical and optical isolation is provided by narrow grooves which may be empty or filled with a dielectric such as silicon dioxide to isolate adjacent photodiodes. The upper surface of the substrate is adapted for receiving radiant energy with radiant energy passing below a predetermined depth being absorbed by the PN junction formed by the N layer and the P-type substrate or by the P substrate itself. The photodiode in combination with the P type substrate includes the characteristic of a vertical PNP transistor at times the PN junction between the P region and the N-type layer is forward biased.

A voltage peak detector is described for sensing the peak voltage across the photodetector.

In addition, a method for fabricating the photodiode array is described.

Individual photodiodes may also be fabricated if so desired.

BRIEF DESCRIPTION OF THE DRAWINGS

FIG. 2 is a cross-section view along the lines II-II of FIG. 1;

FIG. 3 is a cross-section view along the lines III-III of FIG. 1;

DESCRIPTION OF THE PREFERRED EMBODIMENT

Figure 1:
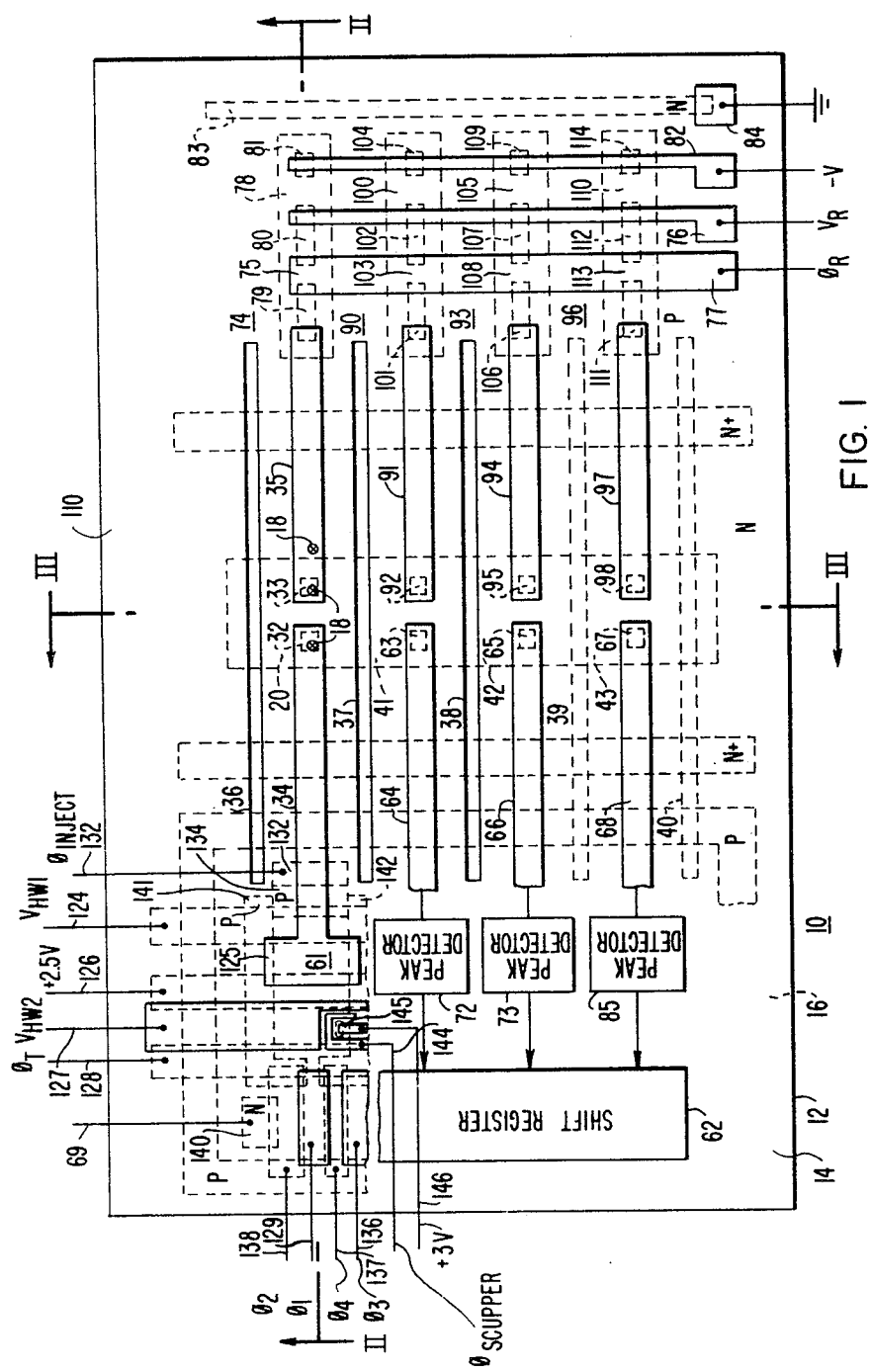
FIG. 1 is a top view of one embodiment of the invention.

Referring to the drawing and in particular to FIG. 1, a sensor 10 is shown for converting radiant energy into electrical signals. Substrate 12 is comprised of monocrystalline material which may, for example, by silicon, indium antimony or germanium. Substrate 12 has an upper surface 14 and a lower surface 16 and may be 0.038 centimeters thick. The upper surface 14 is adapted for passing radiant energy 18 into substrate 12. Radiant energy 18 may, for example, be in the infrared spectrum having wavelengths from 6300 to 8500 angstroms, for example. Radiant energy 18 may originate from a laser or from a scene in a field of view. Appropriate optics may be used to direct and focus the image onto sensor 10. Monocrystalline substrate has a predetermined crystalline orientation to permit selective etching of grooves or slots within substrate 12 from upper surface 14. For example, if substrate 12 is silicon, then upper surface 14 may, for example, be in the (110) plane.

FIG. 2 shows a cross-section view along lines II-II of FIG. 1 showing in the central portion, the structure of detector 20 for sensing radiant energy. As shown in FIG. 2, region 22 extends from the upper surface 14 to a predetermined depth which may, for example, be in the range from 6 to 8 micrometers and has a first conductivity type such as P-type material. The upper surface above region 22 is adapted for receiving radiant energy 18. A mask 19 may be used to shield selected areas of upper surface 14 and to provide an aperture for passing radiant energy 18 into desired regions, for example, region 22. Region 22 has suitable dopings for absorbing a portion of the radiant energy passing into region 22. Region 24 has portions formed below region 22 to a predetermined depth, for example, from 14 to 18 micrometers below upper surface 14 and may extend on either side of region 22 from the upper surface 14 to the predetermined depth. Region 24 is of a second conductivity type such as N-type material forming a PN junction 26 at the intersection of region 22 and region 24.

Substrate 12 is doped with impurities to form a first conductivity type such as P-type. Region 24 forms a PN junction 28 with substrate 112 at the intersection of region 24 and substrate 12.

Upper surface 14 has a layer of silicon dioxide 30. A layer of silicon nitride 31 may be deposited over the layer of silicon oxide 30 on upper surface 14. The thickness of the silicon nitride layer 31 and silicon dioxide layer 30 is adjusted to be a one-quarter wavelength thick or an odd multiple thereof of radiant energy 18 at a desired wavelength to enhance the capture or optical reflection of radiant energy 18 within region 22. Region 22 has heavily doped regions 32 and 33 which are of the same conductivity type as region 22 to facilitate ohmic contact of metallization to region 22. Metallization 34 is in ohmic contact with region 32 and metallization 35 is in ohmic contact with region 33. Metallization 34 and 35 may, for example, be alluminum.

Referring to FIGS. 1 and 2, on either side of detector 20 are grooves or slots extending from upper surface 14 towards the lower surface 16 having a depth which exceeds the depth of region 24 which functions to provide electrical and optical isolation between detector 20 and adjacent detectors located on the other side of the grooves. Grooves 36 through 40 as shown in FIG. 1 may, for example, be 1 through 4 micrometers wide and 14 through 20 micrometers deep. Grooves 36 through 40 may, for example, be open or filled with dielectric such as silicon dioxide by oxidizing the walls of grooves 36 through 40. Grooves 39 and 40 are shown filled. The grooves are oriented in line with a preferred crystalline orientation such that the side walls of grooves 36 through 40 may be vertical or transverse to the upper surface 14. For example, grooves 36 through 40 may be aligned in the direction of the (111) plane with the side walls of grooves 36 tthrough 40 being the (111) plane which is the case for silicon when the upper surface 14 is in the (110) plane.

As shown in FIG. 3, grooves 39 and 40 are filled with silicon dioxide while grooves 36 through 38 are open or empty.

In addition to detector 20 shown in FIG. 1, detectors 41 through 43 are positioned between grooves 37 through 40. Detector 41 is positioned between grooves 37 and 38 and has a P region 46 below upper surface 14 and an N region 47 having portions below region 46 and forming a PN junction 44 at the intersection. N region 47 forms a PN junction 45 with substrate 12. Detector 42 has P region 48 below upper surface 14 and an N region 49 having portions below region 48 and forming a PN junction 50 with region 48. N region 49 forms a PN junction 51 with substrate 12. Detector 43 has a P region 54 below upper surface 14 and between grooves 39 and 40. Region 55 has portions below region 54 and is doped with N-type impurities to form N material which forms a PN junction 56 with region 54. N region 55 forms a PN junction 57 with substrate 12. On the other side of groove 40 is P region 58 and N region 59. On the other side of groove 36 is P region 60 and N region 59. Regions 58 through 60 are not necessary but provide the appearance of a detector with respect to grooves 40 and 36 so that end effects are minimized with detectors 43 and 20. Regions 58 and 59 form a dummy detector adjacent groove 40 and region 60 and 59 form a dummy detector adjacent groove 36.

Detector 20 has an output coupled over metallization 34 to an input of peak detector 61 having an output coupled to CCD shift register 62. Detector 41 is coupled through a P+ region 63 over metallization 64 to an input of peak detector 72 having an output coupled to CCD shift register 62. Detector 42 has an output coupled through a P+ region 65 over metallization 66 to an input of peak detector 73 having an output coupled to CCD shift register 62. Detector 43 is coupled through P+ region 67 over metallization 68 to an input of peak detector 85 having an output coupled to CCD shift register 62.

Peak detectors 61, 72, 73 and 85 function to provide at its output the highest voltage on its input over a predetermined time interval. The peak detector is desired because the voltage across the photodiode, such as PN junction 26, during forward bias condition decays in voltage with a drop in radiant energy 18. Therefore, the largest voltage across junction 26 is stored indicative of the peak radiant energy intensity (photons/sec). When PN junction 26 is reversed biased, the junction is discharged according to the number of carriers received during the predetermined time interval. Since the voltage continually increases in potential, the diode acts as an integrator when in reverse bias condition.

As shown in FIG. 1, CCD shift register 62 may be a four-bit shift register having parallel input and serial output on metallization 69. CCD shift register has appropriate clock signals such as $\phi_1$ through $\phi_4$ for shifting charge injected into the shift register from metallizations 34, 64, 66 and 68. A method for transferring charge into CCD shift register 62 with the minimum of noise is described in U.S. Pat. No. 4,112,456 which issued on Sept. 5, 1978, entitled "Stabilized Charge Injector for Charge Coupled Devices With Means for Increasing the Speed of Propagation of Charge Carriers" to D. R. Lampe, M. H. White and A. S. Jensen and assigned to the assignee herein which is incorporated herein by reference.

Figures 4, 5:
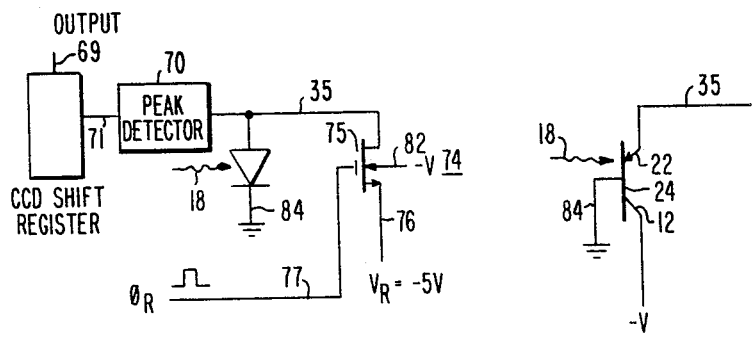
FIG. 4 is a schematic circuit of one photodiode and a reset transistor shown in FIG. 1.
FIG. 5 is a schematic circuit of a phototransistor.

As shown in FIGS. 1 and 4, photodetector 20 is also coupled to reset circuitry 74 for placing a predetermined voltage such as −5 volts on region 22 with respect to region 24. In FIG. 4, metallization 34 is coupled to the drain of transistor 75 which may, for example, be an N channel MOS transistor. The body of transistor 75 is coupled to −V potential which may be −7 volts and the source is coupled over line 76 to a voltage $V_R$ which may, for example, be −5 volts. The gate of transistor 75 is coupled over line 77 to a control signal $\phi_R$. Reset circuitry 74 is shown implemented in FIG. 1 within region 78 which extends from upper surface 14 into substrate 12 and may be doped with P type material. N regions 79 and 80 are spaced apart by a predetermined distance within region 78 and extend from upper surface 14 to form the drain and source respectively of transistor 75. Metallization 77 on silicon nitride 31 forms the gate electrode of transistor 75 extending between regions 79 and 80. Ohmic contact is made to region 78 through P+ region 81 which is in contact with metallization 82. An N+ region 83 extends from upper surface 14 into N region 24 and extends along the reset circuitry 74, 90, 93 and 96 for the detectors 20, 41, 42 and 43, respectively, to provide a low ohmic resistance across region 24. Metallization 84 is in ohmic contact with region 83 to couple a predetermined voltage such as ground potential to region 24. Metallization 76 is in ohmic contact with the source 80 of transistor 75.

Detector 41 is coupled to reset circuitry 90 by way of metallization 91 which is an ohmic contact with P+ diffusion 92 which is in region 46. Detector 42 is coupled to reset circuitry 93 by means of metallization 94 and P+ region 95 which is formed in region 48. Detector 43 is coupled to reset circuitry 96 by way of metallization 97 and P+ region 98 which is formed in region 54. Reset circuitry 90 is formed in a P region 100 having N regions 101 and 102 which are spaced apart to form the drain and source of tdransistor 103 having metallization 77 acting as its gate. Region 101 is an ohmic contact with metallization 91 and region 102 is in ohmic contact with metallization 76. P+ region 104 is formed in P region 100 and is in ohmic contact with metallization 82.

Reset circuitry 93 is formed in P region 105 having N regions 106 and 107 formed therein which are spaced apart by a predetermined distance. N regions 106 and 107 form the drain and source of transistor 108 which has metallization 77 acting as its gate. N region 106 is in ohmic contact with metallization 94 and N region 107 is in ohmic contact with metallization 76. P+ region 109 is formed in P region 105 and is in ohmic contact with metallization 82.

Reset circuitry 96 is formed in P region 110 having N regions 111 and 112 formed therein which are spaced apart by a predetermined distance. N regions 111 and 112 form the drain and source respectively of transistor 113 having metallization 77 acting as its gate. Region 111 is in ohmic contact with metallization 97 and region 112 is in ohmic contact with metallization 76. P+ region 114 is formed in P region 110 and is in ohmic contact with metallization 82.

Referring to FIGS. 1 and 2, peak detectors 61, 72, 73 and 85 and shift register 62 are constructed in N region 120 extending from upper surface 14 down to a depth of, for example, 4 micrometers. A P region 122 surrounds N region 120 which extends from upper surface 14 into P type substrate 12.

Figure 7:
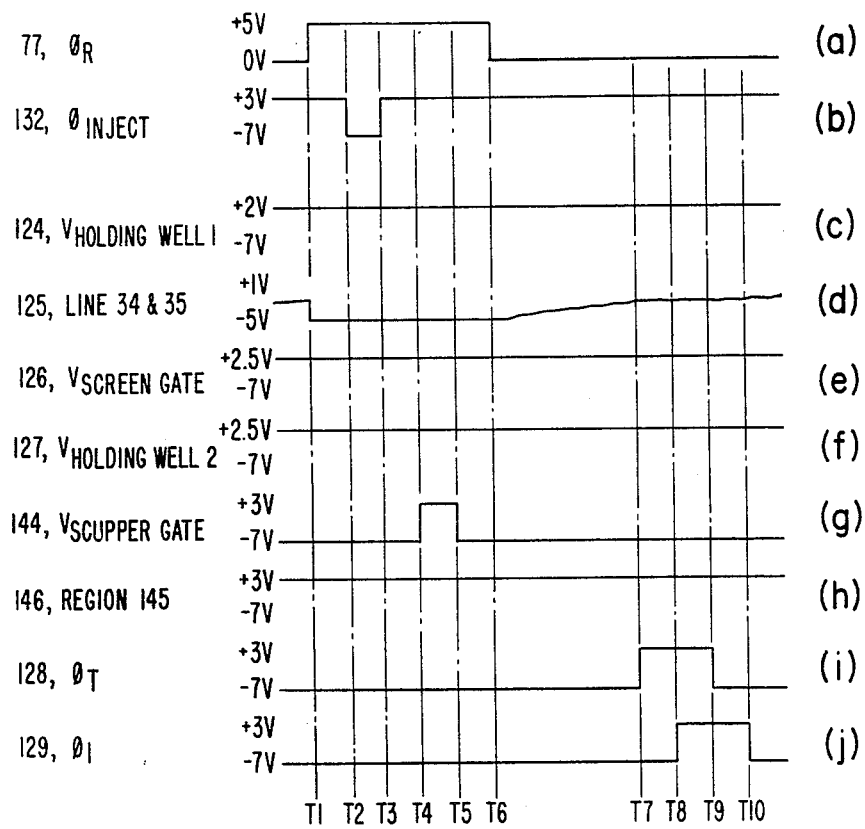
FIG. 7 is a graph showing waveforms for the operations of the embodiment in FIG. 1.

A charge coupled device channel is formed in N region 120 by a number of electrodes positioned adjacent one another on silicon nitride 31. In FIG. 2, electrodes 124 through 129 are shown adjacent one another for moving charge injected by N+ region 132 when signal $\phi_{inject}$ goes from +3 volts to −7 volts. A P region 134 adjacent 132 provides a potential barrier to prevent injected charge from flowing back into region 132 when signal $\phi_{inject}$ goes from −7 volts to +3 volts as shown in FIG. 7B. Electrode 124 has a voltage $V_{HW1}$ of 2 volts to generate a holding well for charge. Electrode 125 meters the charge from the holding well under electrode 124 as the voltage on electrode 125 goes more positive due to photodetector 20. Electrode 126 is at a voltage of 2.5 volts and is called the screen gate. Electrode 127 functions to provide a holding well for charge in the channel. Electrode 128 functions to transfer charge at appropriate times from the holding well under electrode 127 to under electrode 129. Electrodes 129, 136 through 138 form one bit position of a four phase shift register. Region 140 functions to collect charge under electrode 138 and to provide an output in the form of a voltage on line 69.

Peak detector 61 has regions 141 and 142 on either side of its channel 130 to contain the charge within the channel. Means for emptying charge under electrode 127 from the channel 130 is provided by electrode 144 which is coupled to signal $\phi_{scupper}$ and N region 145 which is coupled to metallization 146 as an ohmic contact which is coupled to +3 volts potential. When signal $\phi_{scupper}$ goes from −7 volts to 3 volts the channel underneath electrode 127 is coupled to N region 145 which is at 3 volts potential and drains off any charge in channel 130 underneath electrode 127.

In operation, photodiodes 20, 41, 42 and 43 are reset to a predetermined voltage such as −5 volts with respect to the potential of region 24 so that PN junctions 26, 44, 50 and 56 are reverse biased. The diodes may be reset in as short a time as 20 nanoseconds by action of reset circuitry 74, 90, 93 and 96. Radiant energy 18 passes through upper surface 14 into region 22 where a portion of radiant energy 18 is absorbed generating hole-electron pairs. The photogenerated charge or holes are either annihilated by recombination in region 22 or collected by PN junction 26. For low level optical signals PN junction 26 remains reversed biased and the photo generated charge or holes are integrated. For high level optical signals PN junction 26 is forward biased and the detector operates in the photovoltaic mode. The time interval of optical signals forming radiant energy 18 may be as short as 100 nanoseconds.

When PN junction 26 is forward biased, minority carriers or holes will be injected through region 24 to PN junction 28 which is reverse biased such as $-7$ volts PN junctions 26 and 28 operate as a PNP bipolar transistor if region 24 has a long recombination lifetime. Without PN junction 28, minority carriers in region 24 would either recombine in region 24 or laterally diffuse to neighboring detectors resulting in blooming. With PN junction 28 reverse biased and PN junction 26 forward biased, minority carriers or holes in region 24 flow into substrate 12 and into the substrate voltage supply, $-V$.

FIG. 5 shows a schematic of a photo transistor 86 to illustrate electrically the condition when PN junction 26 is forward biased due to absorption of radiant energy 18 in region 22 shown in FIG. 2. Region 22 acts as the emitter, region 24 acts as the base and substrate 12 acts as the collector. The output voltage from region 22 on line 35 is referenced to the potential of region 24 which is shown in FIG. 5 coupled to ground.

Figure 6:
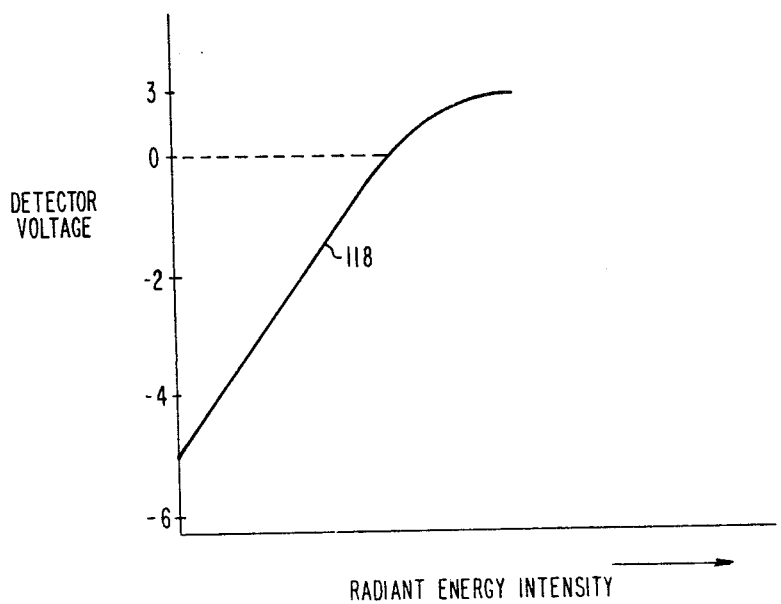
FIG. 6 is a graph showing photodetector voltage versus radiant energy intensity of the typical response of a photodiode in FIG. 1.

FIG. 6 is a graph showing the photodetector voltage versus radiant energy intensity impinging thereon. In FIG. 6, the ordinate represents voltage and the abscissa represents radiant energy intensity. In FIG. 6, curve 118 was plotted after first resetting the potential of region 22 to $-5$ volts with respect to region 24 of an embodiment such as detector 20. Curve 118 is monotonic and linear when PN junction 26 is reversed biased, from $-5$ to 0 volts, and non-linear, logarithmic, when the voltage across PN junction 26 is greater than 0 volts. Thus, detector 20 as shown by curve 118 has a very high dynamic range for sensing radiant energy intensity. In the range from $-5$ V to 0 V, the detector is integrating the number of photons received. In the range from 0 V to 0.3 V and above the detector is responding to the number of photons/second received and the voltage will decay toward 0 volts if the rate, photons per second, drops.

Very low cross-talk is achieved between adjacent detectors each having a high dynamic range because when the detector is reversed biased, radiant energy 18 absorbed below PN junction 28 results in photogenerated charge either being recombined in substrate 12 or collected by PN junction 28. Radiant energy 18 absorbed in region 24 may have charge collected by PN junctions 26 or 28, annihilated by recombination, or may have charge laterally diffuse to another detector over a long path length around one or more grooves or slots 36 through 40. Radiant energy 18 absorbed in region 22 may have charge collected by PN junction 26, annihilated by bulk or surface recombination, or laterally diffuse to another detector over a long path length. Again, the long path lengths are provided by grooves or slots 36 through 40.

The charge that is collected by PN junction 26 raises the potential of region 22 with respect to region 24 and appears as an output signal or voltage on metallization 34.

When radiant energy 18 is sufficient to forward bias PN junction 26, the charge crossing PN junction 26 is transported to substrate 12 by transistor action of PN junctions 26 and 28. Therefore, charge in region 24 will not build up to laterally diffuse in region 24 to other detectors which may be in the reverse bias mode. Charge generated by absorption of radiant energy 18 in region 24 and substrate 12 will be carried to voltage potential $-V$. The charge generated in region 22 and crossing PN junction 26 will be sensed by detector 20.

The reset circuitry 74, 90, 93 and 96 may be as shown in FIG. 4. In operation $\phi_R$ goes high from $T_1$ to $T_6$ as shown in FIG. 7A causing transistor 75 to conduct or be turned ON. The potential $V_R$ of $-5$ volts, for example, will be coupled to detector 20 over line 35 pulling or charging the anode or region 22 and line 34 to $-5$ volts potential shown in FIG. 7O. At time $T_6$, $\phi_R$ goes low causing transistor 75 to be non-conducting or turned off. With transistor 75 turned off, line 35 and region 22 will be floating. Reset times as short as 20 nanoseconds are possible. Transistor 75 is connected in the common source configuration to enhance the reset time (20 nanoseconds).

Figure 8:
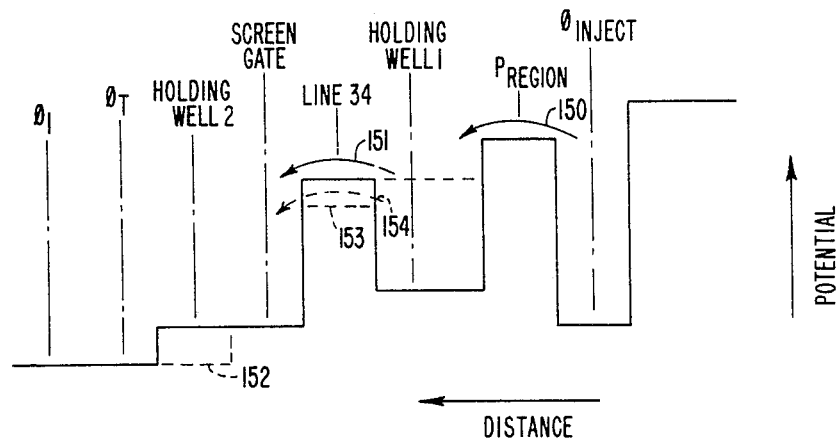
FIG. 8 is a graph showing the potential of the electric field versus distance in along the CCD channel of the peak detector of FIG. 1.

The operation of the peak detector 61 may be described by referring to FIGS. 7A through 7J which shows the waveforms on various electrodes and lines. FIG. 8 shows the potential in channel 130 under electrodes 124 through 129. At T1, $\phi_R$ signal goes high clamping line 34 and 35 to $-5$ volts. At T2, signal $\phi_{inject}$ goes from 3 volts to $-7$ volts causing electrons to spill over the potential barrier of P region 134 into the holding well below electrode 124 as shown by arrow 150 in FIG. 8. The electrons also spill over the potential barrier in channel 130 underneath electrode 125 which is at $-5$ volts potential as shown by arrow 151. At T3, $\phi_{inject}$ on line 132 goes from $-7$ volts to 3 volts stopping any further injection of charge.

At T4, signal $V_{scupper}$ gate goes from $-7$ volts to 3 volts; charge in the channel below electrodes 126 and 127 are removed through region 145 and line 146 which is at 3 volts potential. Dashed line 152 shows the lower potential caused by region 145 which drains charge from underneath electrodes 127 and 126. At T5, signal $V_{scupper}$ gate goes from 3 to $-7$ volts uncoupling region 145 from channel 130.

At T6, $\phi_R$ goes low setting lines 34 and 35 free to float or go positive as photogenerated carriers are collected. As lines 34, 35 and electrode 125 goes positive the potential barrier underneath electrode 125 decreases allowing electrons underneath electrode 124 to spill over under electrodes 126 and 127. Dashed line 153 shows a drop in the potential barrier in FIG. 8 and arrow 154 indicates the flow of electrons. The more positive electrode 125 goes, the more electrons will spill into the channel underneath electrodes 127 and 126. The peak voltage on electrode 125 is measured by emptying the potential well underneath electrode 124 in response to the peak voltage. At T7, $\phi_T$ goes from $-7$ to 3 volts attracting the charge from underneath electrodes 127 and 126. At T8, $\phi_1$ goes from $-7$ to 3 volts attracting the charge from underneath electrode 128 to underneath electrode 129 in CCD shift register 62. At T9, $\phi_T$ goes from $-7$ to 3 volts. At T10, $\phi_1$ goes from $-7$ to 3 volts while $\phi_2$ will be at 3 volts to attract charge.

The embodiment in FIG. 1 may be fabricated by first doping a silicon substrate with P-type impurities such as boron to a concentration, such as $3 \times 10^{14}$ atoms per cubic centimeter or in the range of 40-50 ohm centimeter.

An N diffusion is made in regions of future detectors to a depth of 16 micrometers, for example.

An N epitaxial layer may be deposited over the P-type substrate and N diffusion having a thickness, for example, of 4 micrometers and having a doping level of N-type impurities such as phosphorus at a concentration of $4 \times 10^{15}$ atoms per cubic centimeter.

P type regions may be formed in the N-type epitaxial layer and above the N diffusions by diffusing or ion implanting P-type impurities, such as boron to a concentration of $2 \times 10^{16}$ atoms per cubic centimeter. An oxide or resist mask on the upper surface may be used to define the P-type regions.

A silicon dioxide layer and a silicon nitride layer is then formed on the upper surface of the substrate. Openings are then made in the silicon dioxide and silicon nitride layer.

A suitable etchant such as KOH is used to etch the silicon where exposed by the openings to form grooves or slots in the substrate to isolate the detectors. The openings should be aligned within $\frac{1}{4}$ of a degree with the (111) plane as it intersects the surface which should be in the (110) plane to form deep vertical grooves with smooth side walls in the (111) plane.

The grooves or slots may be filled by oxidation using a silicon nitride mask to prevent oxidation of the upper surface during this step or the grooves may be left open.

P+ regions are ion implanted or diffused into the P regions to provide areas suitable for making ohmic contact to aluminum metallization which is subsequently deposited after openings are provided.

N+ regions may be formed by ion implantation or diffusion in P regions to form the drain and source of an N-channel MOS transistor. The gate dielectric may be grown for the transistor after removing the silicon nitride and the silicon dioxide. Metallization may be deposited to form the gate electrode.

We claim:

1. A sensor for converting radiant energy into electrical signals comprising:
    a crystalline substrate having a predetermined crystalline orientation and an upper surface and lower surface;
    said upper surface adapted for passing radiant energy into said substrate;
    a first region of a first conductivity type positioned below said upper surface for receiving and absorbing a portion of said radiant energy;
    a second region of a second conductivity type positioned below said first region and forming a first P-N junction with said first region at a first predetermined depth below said upper surface;
    said first and second regions having portions thereof physically separated to form a plurality of detectors by grooves in said substrate, said grooves extending from said upper surface towards the lower surface and having side walls bounded by selected crystalline planes of said substrate for electrically and optically isolating each of said plurality of detectors;
    a third region of a first conductivity type positioned below said second region and forming a second P-N junction with said second region at a second predetermined depth below said upper surface, and first, second and third region exhibiting bipolar transistor action at times said first P-N junction is forward biased;
    means for detecting the peak voltage of said first region with a shift register coupled to said means for detecting the peak voltage, and which peak voltage detecting means includes a charge coupled device having means for injecting charge into a channel having electrodes over said channel for controlling the flow of charge in said channel, and a P region adjacent the charge injecting means forming a first potential barrier, and wherein one of said electrodes over said channel of said charge coupled device forms a second potential barrier separated from said first potential barrier by a first holding well and having a second holding well on the other side of said second potential barrier.

2. The sensor of claim 1 wherein said means for injecting includes setting said first potential barrier greater than said second potential barrier, means for filling said first holding well with charge, means for emptying said second holding well of charge that may have passed over said second potential barrier at times said first holding well was filled, means for setting said second potential barrier in response to the voltage potential of said first region and means for sensing the charge that flowed over said second potential barrier into said second well from said first holding well.

3. The sensor of claim 7 wherein said means for emptying said second holding well of charge includes a scupper electrode positioned adjacent said channel and second holding well coupled to a control signal and an N region adjacent said scupper electrode coupled to a bias voltage to drain off charge in said second holding well at times said control signal provides an attractive region for charge underneath said scupper electrode.

4. A sensor for converting radiant energy into electrical signals comprising:
    a crystalline substrate having a predetermined crystalline orientation and an upper surface and lower surface;
    said upper surface adapted for passing radiant energy into said substrate;
    a first region of a first conductivity type positioned below said upper surface for receiving said absorbing a portion of said radiant energy;
    a second region of a second conductivity type positioned below said first region and forming a first P-N junction with said first region at a first predetermined depth below said upper surface;
    said first and second regions having portions thereof physically separated to form a plurality of detectors by grooves in said substrate, said grooves extending from said upper surface towards the lower surface and having side walls bounded by selected crystalline planes of said substrate for electrically and optically isolating each of said plurality of detectors;
    a third region of a first conductivity type positioned below said second region and forming a second P-N junction with said second region at a second predetermined depth below said upper surface, said first, second and third region exhibiting bipolar transistor action at times said first P-N junction is forward biased;
    means for detecting the peak voltage of said first region with a shift register coupled to said means for detecting the peak voltage, and which peak voltage detecting means includes a charge coupled device having means for injecting charge into a channel having electrodes over said channel for controlling the flow of charge into said channel;

means for emptying charge underneath a selected electrode including a scupper electrode positioned adjacent said channel and said selected electrode coupled to a control signal, and a region having the same conductivity type as said channel adjacent said scupper electrode coupled to a bias voltage to drain off charge underneath said selected electrode at times said control signal provides an attractive region for charge underneath said scupper electrode.

* * * * *